United States Patent
Zhang et al.

(10) Patent No.: US 11,081,404 B2
(45) Date of Patent: Aug. 3, 2021

(54) SOURCE/DRAIN FOR GATE-ALL-AROUND DEVICES

(71) Applicant: INTERNATIONAL BUSINESS MACHINES CORPORATION, Armonk, NY (US)

(72) Inventors: Jingyun Zhang, Albany, NY (US); Alexander Reznicek, Troy, NY (US); Takashi Ando, Tuckahoe, NY (US); Choonghyun Lee, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/400,564

(22) Filed: May 1, 2019

(65) Prior Publication Data
US 2020/0350215 A1 Nov. 5, 2020

(51) Int. Cl.
| | |
|---|---|
| *H01L 21/84* | (2006.01) |
| *H01L 29/16* | (2006.01) |
| *H01L 29/78* | (2006.01) |
| *H01L 29/04* | (2006.01) |
| *H01L 27/12* | (2006.01) |

(Continued)

(52) U.S. Cl.
CPC ...... *H01L 21/845* (2013.01); *H01L 21/02532* (2013.01); *H01L 27/1211* (2013.01); *H01L 29/045* (2013.01); *H01L 29/0673* (2013.01); *H01L 29/0847* (2013.01); *H01L 29/1033* (2013.01); *H01L 29/16* (2013.01); *H01L 29/6681* (2013.01); *H01L 29/66545* (2013.01); *H01L 29/66553* (2013.01); *H01L 29/785* (2013.01); *H01L 2029/7858* (2013.01)

(58) Field of Classification Search
CPC .......... H01L 21/02532; H01L 29/6681; H01L 29/66545
See application file for complete search history.

(56) References Cited

U.S. PATENT DOCUMENTS

| | | | |
|---|---|---|---|
| 4,752,814 A | 6/1988 | Tuan | |
| 5,675,185 A * | 10/1997 | Chen | .................. H01L 27/0688 257/752 |

(Continued)

OTHER PUBLICATIONS

Loubet et al., "Stacked Nanosheet Gate-All-Around Transistor to Enable Scaling Beyond FinFET", 2017 Symposium on VLSI Technology Digest of Technical Papers, Jun. 2017, pp. T230-T231.

(Continued)

*Primary Examiner* — Dale E Page
*Assistant Examiner* — Wilner Jean Baptiste
(74) *Attorney, Agent, or Firm* — Tutunjian & Bitetto, P.C.; L. Jeffrey Kelly

(57) ABSTRACT

A method of forming a nanosheet device is provided. The method includes forming two amorphous source/drain fills on a substrate and one or more semiconductor nanosheet layers between the two amorphous source/drain fills. The method further includes forming a gate dielectric layer on exposed portions of the one or more semiconductor nanosheet layers. The method further includes forming a protective capping layer on the gate dielectric layer, and subjecting the two amorphous source/drain fills to a recrystallization treatment to cause a phase change from the amorphous state to a single crystal or poly-crystalline phase.

15 Claims, 8 Drawing Sheets

(51) Int. Cl.
*H01L 29/06* (2006.01)
*H01L 29/66* (2006.01)
*H01L 21/02* (2006.01)
*H01L 29/10* (2006.01)
*H01L 29/08* (2006.01)

(56) References Cited

U.S. PATENT DOCUMENTS

| | | |
|---|---|---|
| 9,536,877 B2 | 1/2017 | Cai et al. |
| 9,947,804 B1 | 4/2018 | Frougier et al. |
| 9,991,352 B1 | 6/2018 | Frougier et al. |
| 10,014,390 B1 | 7/2018 | Bouche et al. |
| 2012/0289046 A1* | 11/2012 | Ko ............... H01L 21/76883 438/675 |
| 2014/0001441 A1* | 1/2014 | Kim ............. H01L 29/66553 257/29 |
| 2016/0111421 A1 | 4/2016 | Rodder et al. |
| 2017/0148922 A1 | 5/2017 | Hatcher et al. |
| 2017/0179299 A1* | 6/2017 | Bae ............... H01L 29/0673 |
| 2018/0308758 A1 | 10/2018 | Willemann |
| 2019/0214502 A1* | 7/2019 | Xu ............... H01L 29/0673 |

OTHER PUBLICATIONS

Zhang et al., "High-k Metal Gate Fundamental Learning and Multi-VT Options for Stacked Nanosheet Gate-All-Around Transistor", IEEE 2017, Dec. 2017, pp. 22.1.2-22.1-4.

* cited by examiner

SOURCE/DRAIN FOR GATE-ALL-AROUND DEVICES

BACKGROUND

The present invention generally relates to nanosheet devices with gate-all-around structures, and more particularly to nanosheet devices with gate-all-around structures and differing contact poly pitches (CPP).

A Field Effect Transistor (FET) typically has a source, a channel, and a drain, where current flows from the source to the drain, and a gate controls the flow of current through the device channel. Field Effect Transistors (FETs) can have a variety of different structures, for example, planar FETs have been fabricated with the source, channel, and drain formed in the substrate material itself, where the current flows horizontally along the channel (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a metal-oxide-semiconductor field effect transistor (MOSFET) with a single gate parallel with the plane of the substrate. Depending on the doping of the source and drain, an NFET or a PFET can be formed. Two FETs also can be coupled to form a complementary metal oxide semiconductor (CMOS) device, where a p-type MOSFET and n-type MOSFET are coupled together.

SUMMARY

In accordance with an embodiment of the present invention, a method of forming a nanosheet device is provided. The method includes forming two amorphous source/drain fills on a substrate and one or more semiconductor nanosheet layers between the two amorphous source/drain fills. The method further includes forming a gate dielectric layer on exposed portions of the one or more semiconductor nanosheet layers. The method further includes forming a protective capping layer on the gate dielectric layer, and subjecting the two amorphous source/drain fills to a recrystallization treatment to cause a phase change from the amorphous state to a single crystal or poly-crystalline phase.

In accordance with another embodiment of the present invention, a method of forming long channel and short channel nanosheet devices on a substrate is provided. The method includes forming at least two stacks of alternating sacrificial layers and semiconductor nanosheet layers on a substrate, and forming a separate gate sidewall spacer and dummy gate structure across each of at least two of the at least two stacks of alternating sacrificial layers and semiconductor nanosheet layers. The method further includes forming a separate amorphous source/drain fill on each of opposite sides of the at least two of the at least two stacks of alternating sacrificial layers and semiconductor nanosheet layers, and forming a source/drain encapsulation layer on each of the amorphous source/drain fills. The method further includes removing the at least two dummy gate structures, and removing the sacrificial layers from the at least two of the at least two stacks of alternating sacrificial layers and semiconductor nanosheet layers. The method further includes forming a gate dielectric layer on exposed portions of the semiconductor nanosheet layers of the at least two stacks of alternating sacrificial layers and semiconductor nanosheet layers. The method further includes forming a protective capping layer on the gate dielectric layer, and subjecting the amorphous source/drain fills to a recrystallization treatment to cause a phase change from the amorphous state to a single crystal or poly-crystalline phase, wherein the semiconductor nanosheet layers of a first of the at least two of the at least two stacks form shorter device channels than the semiconductor nanosheet layers of a second of the at least two of the at least two stacks.

In accordance with yet another embodiment of the present invention, a long channel and short channel nanosheet devices on a substrate is provided. The long channel and short channel nanosheet devices include two pairs of single crystal or poly-crystalline phase source/drains on the substrate, wherein a first pair of single crystal or poly-crystalline phase source/drains are adjacent to each other, and a second pair of single crystal or poly-crystalline phase source/drains are adjacent to each other. The long channel and short channel nanosheet devices further include one or more semiconductor nanosheet layers between the first pair of adjacent single crystal or poly-crystalline phase source/drains. The long channel and short channel nanosheet devices further include one or more semiconductor nanosheet layers between the second pair of adjacent single crystal or poly-crystalline phase source/drains, wherein the one or more semiconductor nanosheet layers between the first pair of adjacent single crystal or poly-crystalline phase source/drains form shorter device channels than the one or more semiconductor nanosheet layers between the second pair of adjacent single crystal or poly-crystalline phase source/drains, and a source/drain encapsulation layer on each of the two pairs of single crystal or poly-crystalline phase source/drains.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide multiple nanosheet devices having different gate lengths with a gate-all-around structure on the same substrate, where the different gate lengths result in both large and small contact poly pitches (CPP).

Embodiments of the present invention provide a method of fabricating multiple nanosheet devices having different gate lengths with the same source/drain sizes for both large and small contact poly pitches (CPP). A uniform source/drain epitaxy can form uniform source/drains across different CPP with different source/drain trench sizes. A doped amorphous silicon (Si) or silicon-germanium (SiGe) can be used as source/drain (S/D) material at the beginning of fabrication to ensure uniform fill volume and size of S/D material, and the amorphous material subsequently recrystallized.

Embodiments of the present invention provide a method of using direct deposition of doped amorphous silicon (Si) or silicon-germanium (SiGe) as the source/drain (S/D) region material instead of epitaxial growth to ensure a uniform volume and size of the source/drains for both large and small CPP devices. A reliability anneal or other anneal process above a predetermined temperature can recrystallize the amorphous Si or SiGe through solid phase epitaxy to form epitaxial or poly-crystalline material which can lower S/D resistance. Using amorphous semiconductor deposition, any dopant amount can be incorporated and activation can be accomplished by nanosecond or millisecond laser annealing.

Exemplary applications/uses to which the present invention can be applied include, but are not limited to: logic devices (e.g., NAND gates, NOR gates, XOR gates, etc.) memory devices (e.g., static random access memory (SRAM), dynamic random access memory (DRAM), and application specific integrated circuits (ASICs) for mobile devices.

It is to be understood that aspects of the present invention will be described in terms of a given illustrative architecture; however, other architectures, structures, substrate materials and process features and steps can be varied within the scope of aspects of the present invention.

Figure 1:
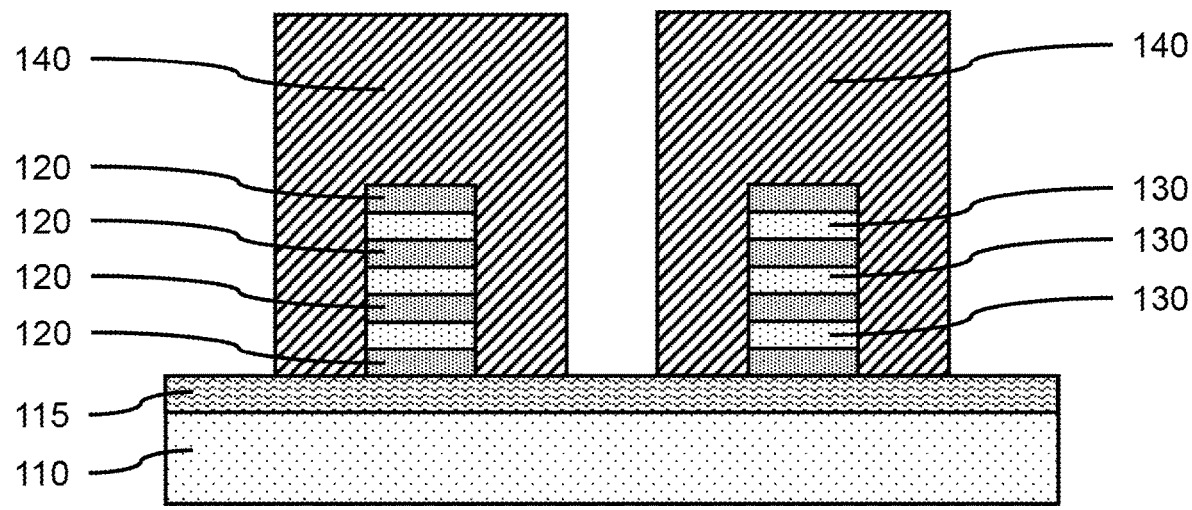
FIG. 1 is a cross-sectional side view showing sacrificial layers and nanosheet layers for nanosheet devices on the same substrate, in accordance with an embodiment of the present invention.

Referring now to the drawings in which like numerals represent the same or similar elements and initially to FIG. 1, a cross-sectional side view of sacrificial layers and nanosheet layers for nanosheet devices on the same substrate is shown, in accordance with an embodiment of the present invention.

In one or more embodiments, a sequence of alternating sacrificial layers 120 and semiconductor nanosheet layers 130 can be formed on a substrate 110 for nanosheet devices. A dummy gate structure can be formed across the sacrificial layers 120 and nanosheet layers 130, where the dummy gate structure can include gate sidewall spacers 140. The gate sidewall spacer(s) 140 can be on the top-most layer of the stack of alternating sacrificial layers 120 and semiconductor nanosheet layers 130 and around opposite sides of the stack. A separate gate sidewall spacer 140 and dummy gate structure can be formed across each of a plurality of stacks of alternating sacrificial layers 120 and semiconductor nanosheet layers 130.

In various embodiments, the materials of the sacrificial layers 120 and semiconductor nanosheet layers 130 can be different semiconductor materials to allow selective removal of the sacrificial layers 120. The sacrificial layers 120 can be, for example, silicon-germanium (SiGe) and the semiconductor nanosheet layers 130 can be silicon (Si), or the materials can be reversed.

In one or more embodiments, the substrate 110 can be a semiconductor wafer or a semiconductor-on-insulator (SeOI) structure, for example a silicon-on-insulator (SOI) structure or a silicon-germanium-on-insulator (SGOI) structure. In various embodiments, the substrate 110 can include a dielectric layer 115, for example, a buried oxide layer (BOX), or the dielectric layer can be formed after the stack of alternating sacrificial layers 120 and semiconductor nanosheet layers 130. In various embodiments, the dielectric layer 115 can cover the underlying portion of the substrate 110, and the alternating sacrificial layers 120 and semiconductor nanosheet layers 130 can be formed on dielectric layer 115. In various embodiments, the alternating sacrificial layers 120 and semiconductor nanosheet layers 130 can be epitaxially grown on a single crystal semiconductor substrate 110. A first sacrificial layer 120 can be between a first semiconductor nanosheet layer 130 and the surface of the substrate 110 or dielectric layer 115, where the first sacrificial layer 120 can be an SiGe layer on the dielectric layer 115.

In one or more embodiments, the dielectric layer 115 can be a dielectric material, including, but not limited to, silicon oxide (SiO), silicon nitride (SiN), silicon oxynitride (SiON), silicon boronitride (SiBN), silicon carbonitride (SiCN), silicon boro carbonitride (SiBCN), and combinations thereof.

In one or more embodiments, a dummy gate structure can be formed across one or more stacks of alternating sacrificial layers 120 and semiconductor nanosheet layers 130 forming nanosheet devices. The dummy gate structure can include a gate sidewall spacer 140, where the gate sidewall spacer can be a dielectric material. In various embodiments, the gate sidewall spacer(s) 140 can be a dielectric material, including, but not limited to, silicon oxide (SiO), silicon nitride (SiN), silicon oxynitride (SiON), silicon boronitride (SiBN), silicon carbonitride (SiCN), silicon boro carbonitride (SiBCN), and combinations thereof. The gate sidewall spacer 140 can be a different dielectric material from the dielectric layer 115.

Figure 2:
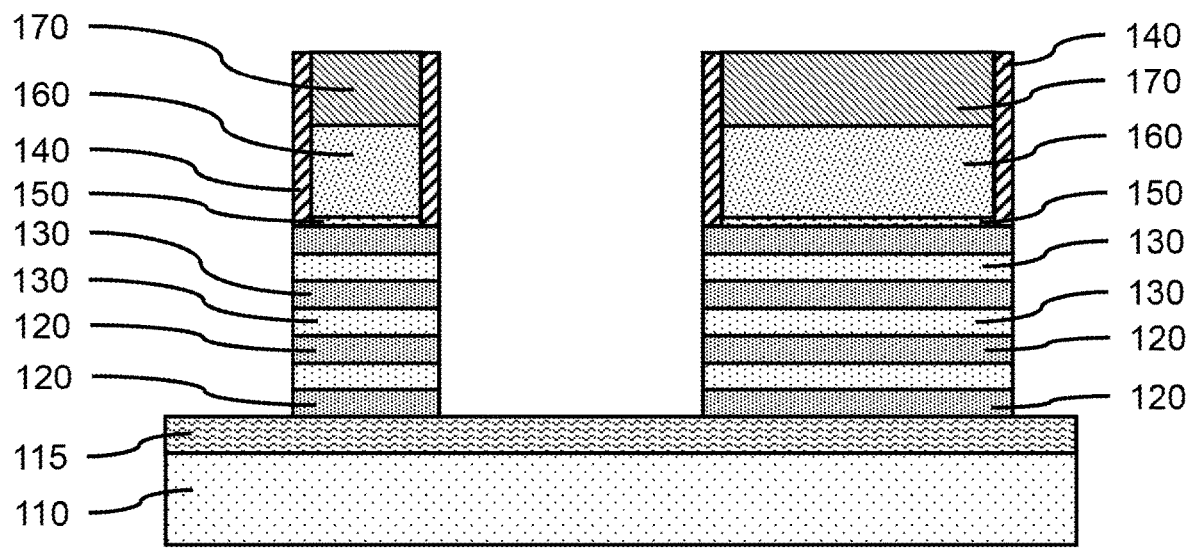
FIG. 2 is a cross-sectional side view perpendicular to FIG. 1 showing sacrificial layers and nanosheet layers for both long channel and short channel nanosheet devices on the same substrate, in accordance with an embodiment of the present invention.

FIG. 2 is a cross-sectional side view perpendicular to FIG. 1 showing sacrificial layers and nanosheet layers for both long channel and short channel nanosheet devices on the same substrate, in accordance with an embodiment of the present invention.

In one or more embodiments, the stacks of alternating sacrificial layers 120 and semiconductor nanosheet layers 130 can be trimmed back to be coplanar with the outer faces of the gate sidewall spacer(s) 140, where the sacrificial layers 120 and semiconductor nanosheet layers 130 can be trimmed back using a directional etch, for example, a reactive ion etch (RIE) with the dummy gate structure and gate sidewall spacer(s) 140 acting as a mask. The gate sidewall spacer(s) 140 can be on the top-most layer of the stack of alternating layers and along the sidewalls.

In one or more embodiments, a dummy gate structure including a dummy gate liner 150, a dummy gate fill 160, and a dummy gate cap 170 can be formed within the gate sidewall spacer(s) 140. In various embodiments, a sacrificial layer 120 can be the top layer between a nanosheet layer 130 and the dummy gate liner 150. In various embodiments, a semiconductor nanosheet layer 130 can be the top layer between a sacrificial layer 120 and the dummy gate liner 150.

In one or more embodiments, the dummy gate liner 150 can be a dielectric material, including, but not limited to, silicon oxide (SiO), silicon nitride (SiN), silicon oxynitride (SiON), silicon boronitride (SiBN), silicon carbonitride (SiCN), silicon boro carbonitride (SiBCN), and combinations thereof, that can protect the underlying sacrificial layers 120 and semiconductor nanosheet layers 130 and provide an etch-stop for removing the dummy gate fill 160. The dummy gate liner 150 can be a different dielectric material from the gate sidewall spacer(s) 140 to provide etch selectivity. In various embodiments, the dummy gate liner 150 can be formed using a directional deposition and/or conformal deposition.

In one or more embodiments, one or more dummy gate structures and underlying stacks of sacrificial layers 120 and semiconductor nanosheet layers 130 can form short channel nanosheet devices, where a short channel nanosheet device can have a channel length in a range of about 5 nanometers (nm) to 50 nm, or between 8 nm to 30 nm, or between 10 nm to 20 nm, although other channel lengths are also contemplated.

In one or more embodiments, one or more dummy gate structures and underlying stacks of sacrificial layers 120 and semiconductor nanosheet layers 130 can form long channel nanosheet devices, where a long channel nanosheet device can have a channel length in a range of about 50 nanometers (nm) to 1000 nm, or between 100 nm to 500 nm, or between 100 nm to 200 nm, although other channel lengths are also contemplated. In various embodiments, the long channel nanosheet devices have a greater channel length than the short channel nanosheet devices.

In various embodiments, the long channel nanosheet devices can be on the same substrate as the short channel nanosheet devices, where at least one long channel nanosheet device can be adjacent to at least one short channel nanosheet device. In various embodiments, the long channel nanosheet devices can be on a different region of the substrate from the short channel nanosheet devices, such that a long channel nanosheet device is not directly adjacent to a short channel nanosheet device.

In one or more embodiments, the dummy gate fill 160 can be an easily removable material, for example, amorphous silicon (a-Si), amorphous carbon (a-C), silicon-germanium (SiGe), or combination thereof, where the dummy gate fill 160 can be selectively removed relative to other exposed materials.

In one or more embodiments, the dummy gate cap 170 can be a dielectric material, including, but not limited to, silicon oxide (SiO), silicon nitride (SiN), silicon oxynitride (SiON), silicon boronitride (SiBN), silicon carbonitride (SiCN), silicon boro carbonitride (SiBCN), and combinations thereof, where the dummy gate cap 170 can be a different dielectric material from the gate sidewall spacer(s) 140 and/or dummy gate liner 150 to provide etch selectivity.

Figure 3:
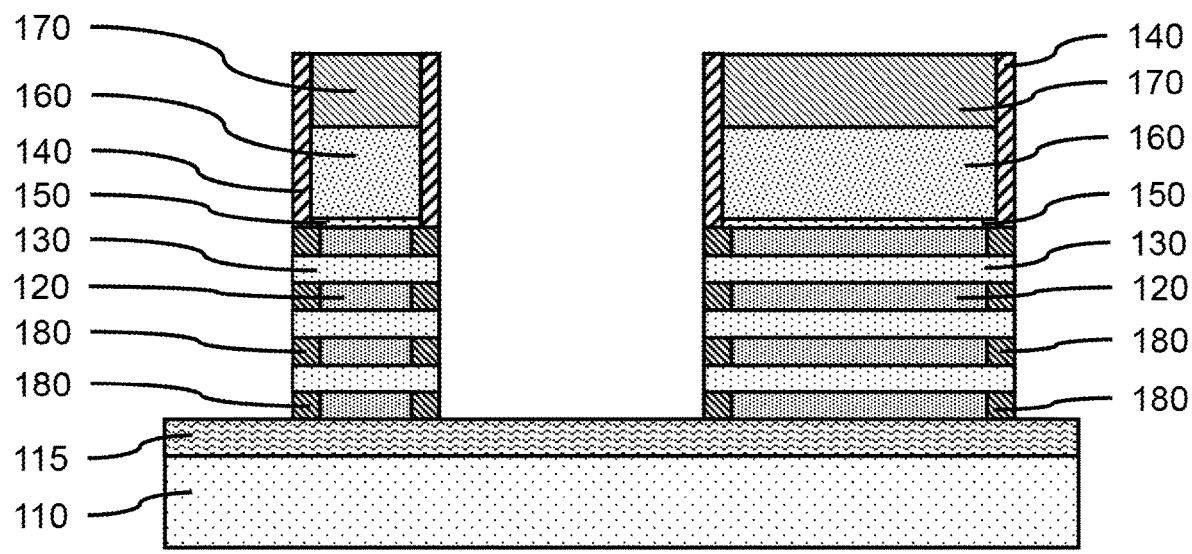
FIG. 3 is a cross-sectional side view perpendicular to FIG. 1 showing inner spacers replacing portions of the sacrificial layers, in accordance with an embodiment of the present invention.

FIG. 3 is a cross-sectional side view perpendicular to FIG. 1 showing inner spacers replacing portions of the sacrificial layers, in accordance with an embodiment of the present invention.

In one or more embodiments, a portion of the sacrificial layers 120 can be removed using a selective isotropic etch, for example, a wet chemical etch or dry plasma etch to form channels. Inner spacers 180 can be formed in the channels using a conformal deposition, for example, atomic layer deposition (ALD), plasma enhanced ALD (PEALD), or a combination thereof. The inner spacers 180 can be on opposite sides of each of one or more sacrificial layers 120. The inner spacers 180 can be a dielectric material, including, but not limited to, silicon oxide (SiO), silicon nitride (SiN), silicon oxynitride (SiON), silicon boronitride (SiBN), silicon carbonitride (SiCN), silicon boro carbonitride (SiBCN), and combinations thereof.

In various embodiments, the inner spacers 180 can be thinner than the width of the gate sidewall spacers 140. In various embodiments, the inner spacers 180 can be thicker than the width of the gate sidewall spacers 140. In various embodiments, the inner spacers 180 can be the same width as the gate sidewall spacers 140.

Figure 4:
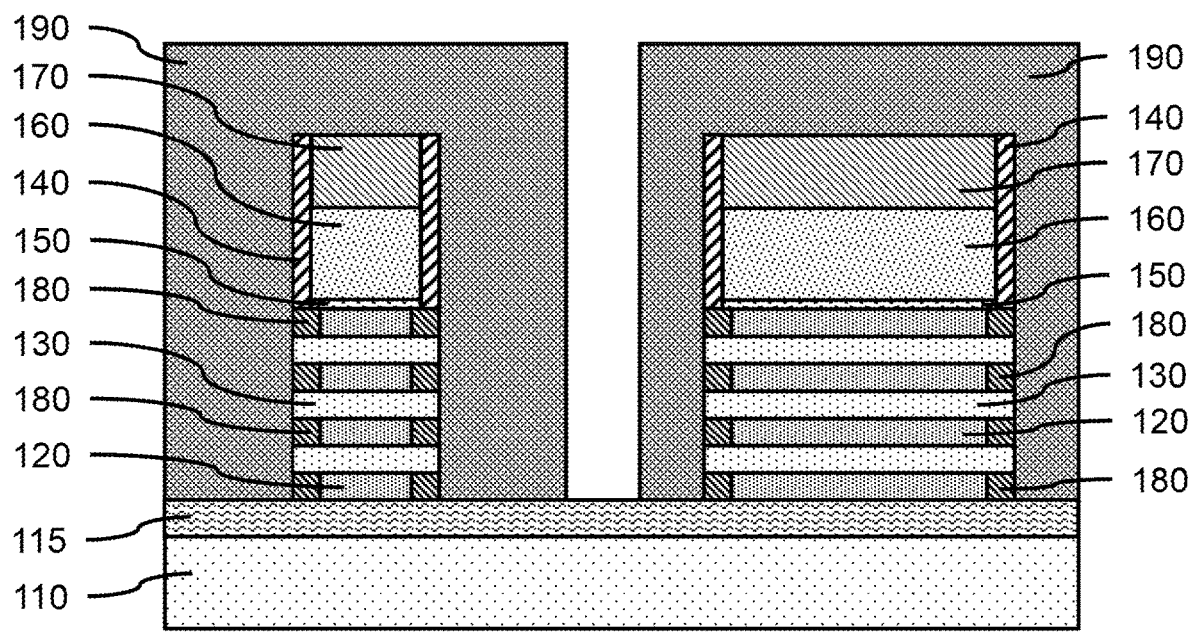
FIG. 4 is a cross-sectional side view perpendicular to FIG. 1 showing amorphous source/drain fills formed adjoining each of the long channel and short channel nanosheet devices, in accordance with an embodiment of the present invention.

FIG. 4 is a cross-sectional side view perpendicular to FIG. 1 showing amorphous source/drain fills formed adjoining each of the long channel and short channel nanosheet devices, in accordance with an embodiment of the present invention.

In one or more embodiments, an amorphous source/drain fill 190 can be formed adjoining opposite sides of each of the stacks of alternating sacrificial layers 120 and semiconductor nanosheet layers 130, where the amorphous source/drain fill 190 can be formed by a blanket deposition, for example, chemical vapor deposition (CVD) or plasma enhanced CVD (PECVD). In various embodiments, the amorphous source/drain fill 190 can be formed by CVD or PECVD at a temperature range of about 500° C. to about 700° C., or about 550° C. to about 650° C. to maintain the source/drain fill 190 in an amorphous state. In various embodiments, the amorphous source/drain fill 190 can be a semiconductor material, for example, silicon or silicon-germanium, doped to form an n-type source/drain (S/D) or a p-type S/D, where doping can be in situ (i.e., during formation of the amorphous source/drain fill 190), or ex situ (i.e., after formation of the amorphous source/drain fill 190), for example, through ion implantation or dopant diffusion.

In a non-limiting exemplary embodiment, the amorphous source/drain fill 190 can be phosphorus-doped silicon (Si:P) to form an n-type source/drain (S/D) or a boron-doped silicon germanium (SiGe:B) to form a p-type S/D.

In various embodiments, the amorphous source/drain fill 190 can extend away from the adjoining face of the stack of sacrificial layers 120 and semiconductor nano sheet layers 130 by a distance in a range of about 20 nm to about 200 nm, or about 30 nm to about 100 nm, although other distances are also contemplated. In various embodiments, there may be a gap between the amorphous source/drain fills on adjacent nanosheet devices.

Figure 5:
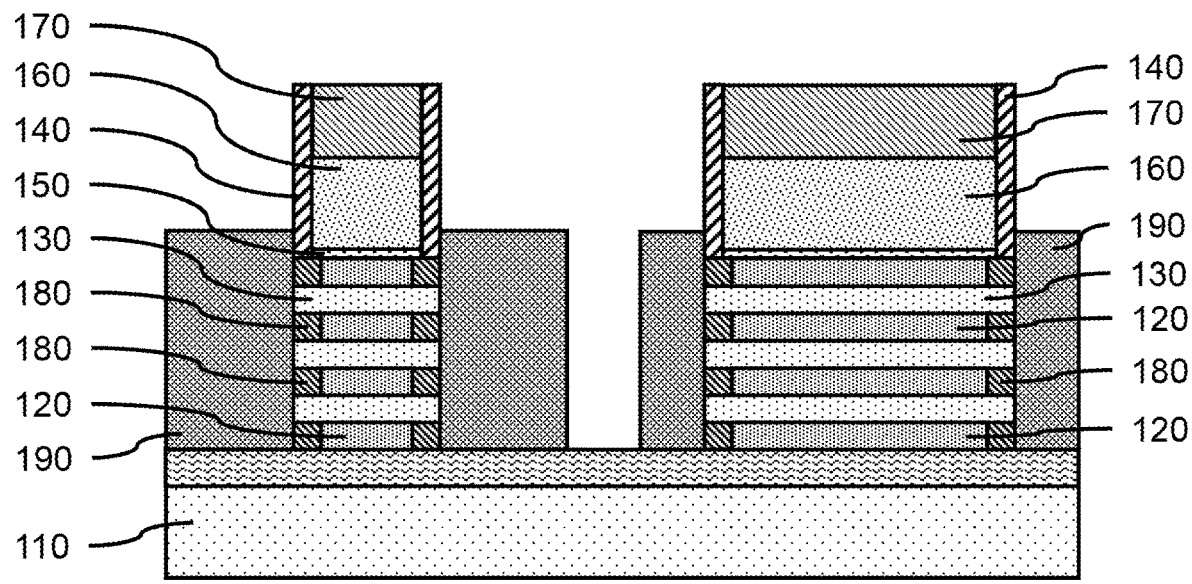
FIG. 5 is a cross-sectional side view perpendicular to FIG. 1 showing the height of the amorphous source/drain fills reduced to expose a portion of the gate sidewall spacers, in accordance with an embodiment of the present invention.

FIG. 5 is a cross-sectional side view perpendicular to FIG. 1 showing the height of the amorphous source/drain fills reduced to expose a portion of the gate sidewall spacers, in accordance with an embodiment of the present invention.

In one or more embodiments, the height of the amorphous source/drain fills 190 can be reduced to expose a portion of the gate sidewall spacers 140, where the height of the amorphous source/drain fills 190 can be reduced using a selective directional (e.g., RIE) or isotropic (e.g., wet chemical or dry plasma) etch. The height of the amorphous source/drain fills 190 can be reduced by about 50 nm to about 150 nm, or about 75 nm to about 100 nm, where the amorphous source/drain fills 190 remain in electrical connection with the device channels after the etch-back.

Figure 6:
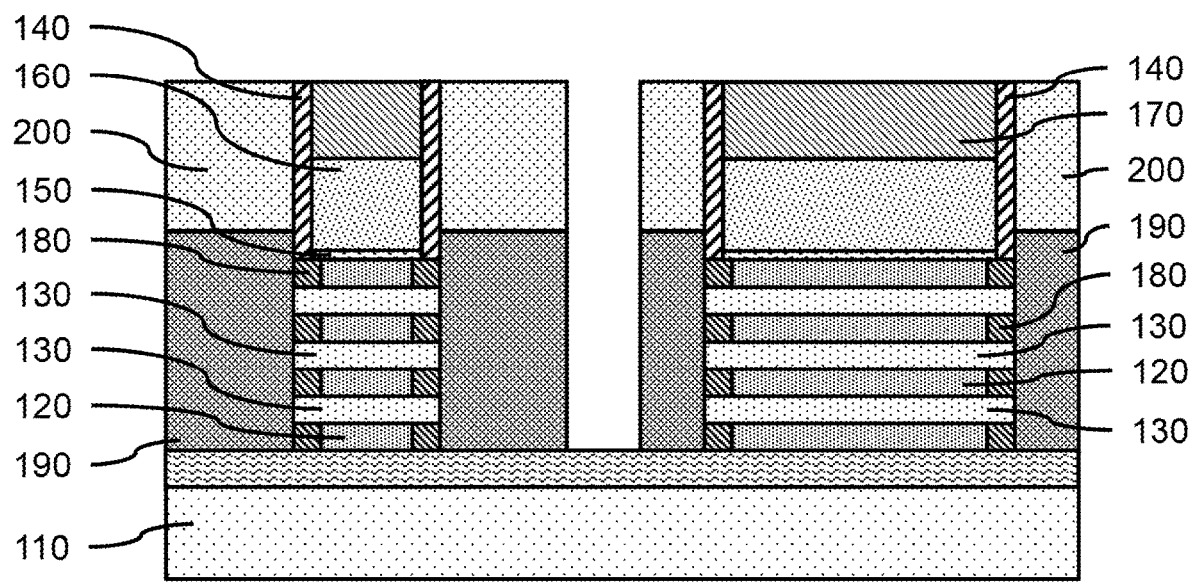
FIG. 6 is a cross-sectional side view perpendicular to FIG. 1 showing a source/drain encapsulation layer formed on the amorphous source/drain fills that covers the portion of the gate sidewall spacers, in accordance with an embodiment of the present invention.

FIG. 6 is a cross-sectional side view perpendicular to FIG. 1 showing a source/drain encapsulation layer formed on the amorphous source/drain fills that covers the portion of the gate sidewall spacers, in accordance with an embodiment of the present invention.

In one or more embodiments, a source/drain encapsulation layer 200 can be formed on the amorphous source/drain fills 190, where the source/drain encapsulation layer 200 covers the surface of the amorphous source/drain fills 190 and exposed portions of the gate sidewall spacers 140. The source/drain encapsulation layer 200 can be formed by a blanket deposition (e.g., CVD, PECVD).

In various embodiments, the source/drain encapsulation layer 200 can be silicon oxide (SiO), silicon nitride (SiN), silicon oxynitride (SiON), silicon boronitride (SiBN), silicon carbonitride (SiCN), silicon boro carbonitride (SiBCN), and combinations thereof. The source/drain encapsulation layer 200 can be a different material from the gate sidewall spacers 140 to provide etch selectivity.

Figure 7:
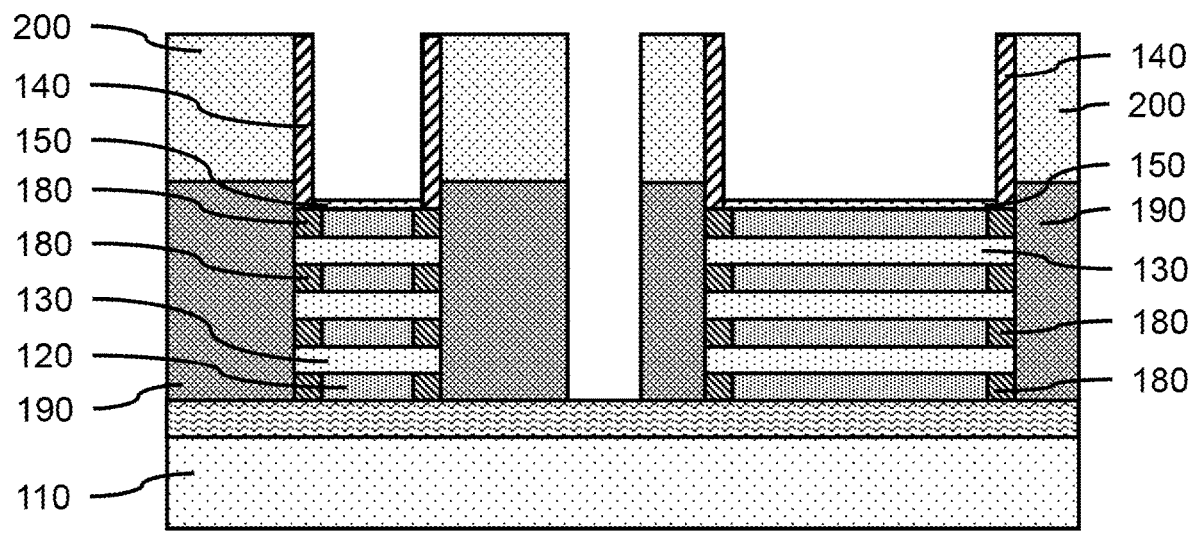
FIG. 7 is a cross-sectional side view perpendicular to FIG. 1 showing the removal of a dummy gate cap and dummy gate fill from each of the dummy gate structures, in accordance with an embodiment of the present invention.

FIG. 7 is a cross-sectional side view perpendicular to FIG. 1 showing the removal of a dummy gate cap and dummy gate fill from each of the dummy gate structures, in accordance with an embodiment of the present invention.

In one or more embodiments, the dummy gate cap 170 can be removed using a selective etch to expose the underlying dummy gate fill 160. The dummy gate fill 160 can be removed using a subsequent selective etch to expose the dummy gate liner 150, where the dummy gate liner can act as an etch stop to protect the sacrificial layers 120 and semiconductor nanosheet layers 130.

Figure 8:
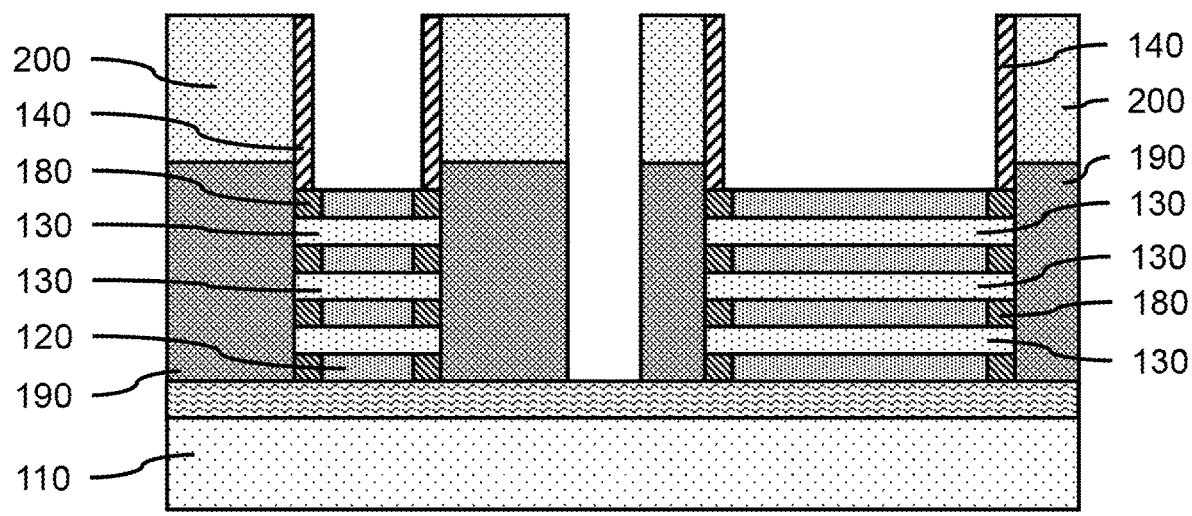
FIG. 8 is a cross-sectional side view perpendicular to FIG. 1 showing the removal of a dummy gate liner from each of the dummy gate structures, in accordance with an embodiment of the present invention.

FIG. 8 is a cross-sectional side view perpendicular to FIG. 1 showing the removal of a dummy gate liner from each of the dummy gate structures, in accordance with an embodiment of the present invention.

In one or more embodiments, the dummy gate liner 150 can be removed using a selective isotropic etch to expose a top sacrificial layer 120 and the sides of the sacrificial layers 120 and semiconductor nanosheet layers 130 between the gate sidewall spacer(s) 140.

Figure 9:
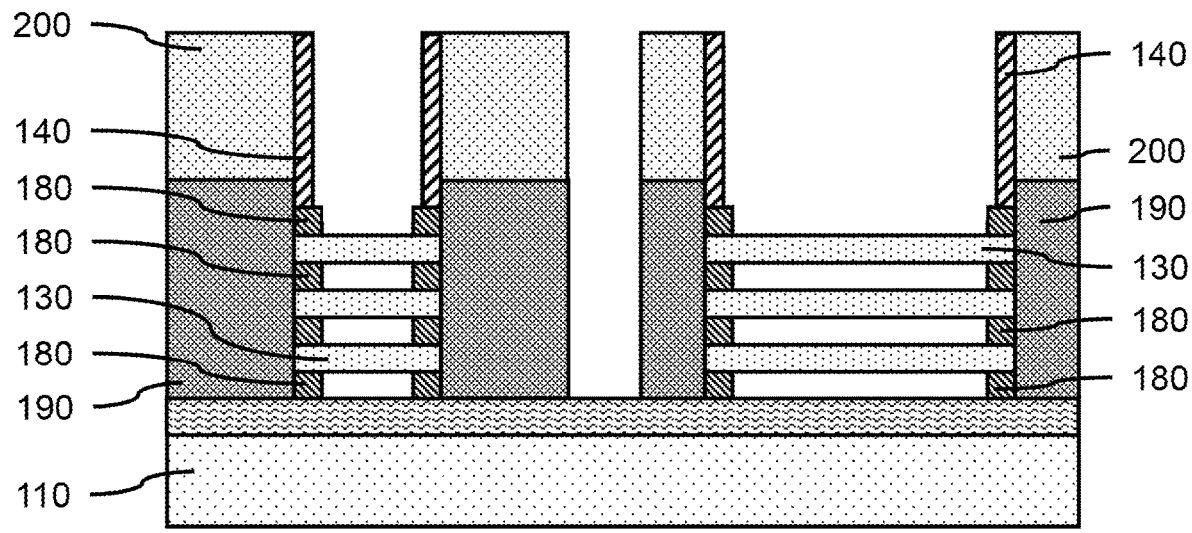
FIG. 9 is a cross-sectional side view perpendicular to FIG. 1 showing the removal of the sacrificial layers, in accordance with an embodiment of the present invention.

FIG. 9 is a cross-sectional side view perpendicular to FIG. 1 showing the removal of the sacrificial layers, in accordance with an embodiment of the present invention.

In one or more embodiments, the sacrificial layers 120 can be removed from between the semiconductor nanosheet layers 130 using a selective, isotropic etch. Removal of the sacrificial layers 120 can expose portions of the semiconductor nanosheet layers 130 between the amorphous source/drain fills 190 not covered by the inner spacers 180.

Figure 10:
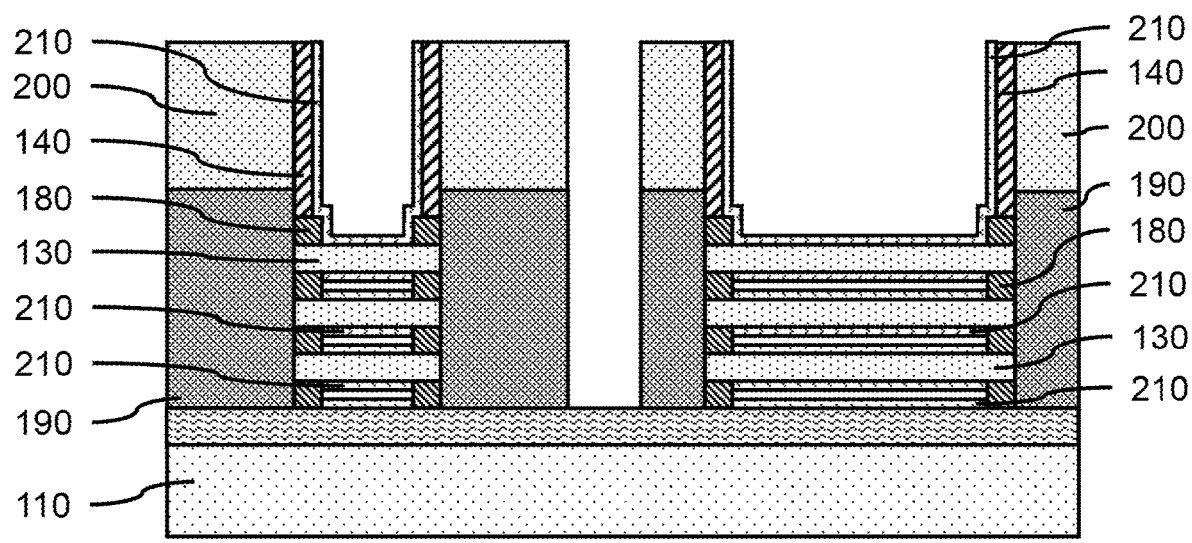
FIG. 10 is a cross-sectional side view perpendicular to FIG. 1 showing the formation of a gate dielectric layer on the nanosheet layers of each of the long channel and short channel nanosheet devices, in accordance with an embodiment of the present invention.

FIG. 10 is a cross-sectional side view perpendicular to FIG. 1 showing the formation of a gate dielectric layer on the nanosheet layers of each of the long channel and short channel nanosheet devices, in accordance with an embodiment of the present invention.

In one or more embodiments, a gate dielectric layer 210 can be formed on the exposed portions of the semiconductor nanosheet layers 130, inner spacers 180, and gate sidewall spacers 140, where the gate dielectric layer 210 can be formed by a conformal deposition (e.g., ALD, PEALD, combinations thereof). The gate dielectric layer 210 can be formed on semiconductor nanosheet layers 130 for each of the long channel and short channel nanosheet devices.

In one or more embodiments, the gate dielectric layer 210 can be a dielectric material, including, but not limited to, silicon oxide (SiO), silicon nitride (SiN), a high-K dielectric material, and combinations thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

Figure 11:
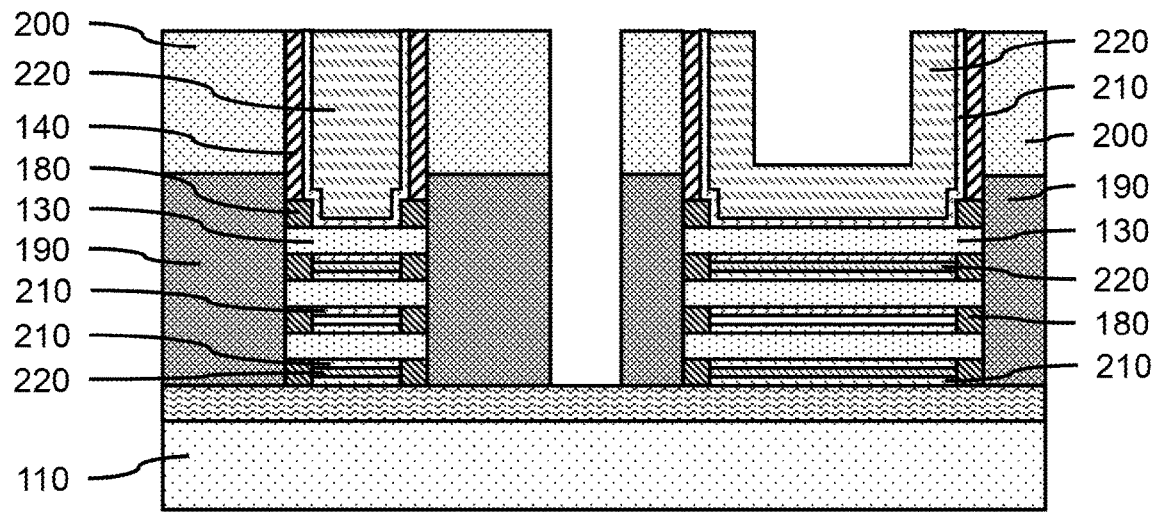
FIG. 11 is a cross-sectional side view perpendicular to FIG. 1 showing the formation of a protective capping layer on the gate dielectric layer and nanosheet layers, in accordance with an embodiment of the present invention.

FIG. 11 is a cross-sectional side view perpendicular to FIG. 1 showing the formation of a protective capping layer on the gate dielectric layer and nanosheet layers, in accordance with an embodiment of the present invention.

In one or more embodiments, a protective capping layer 220 can be formed on the gate dielectric layer 210 and nanosheet layers 130, where the protective capping layer 220 can be formed by a conformal deposition (e.g., ALD, PEALD). The protective capping layer 220 can fill in spaces between the nanosheet layers 130.

In various embodiments, the protective capping layer 220 can be, for example, amorphous silicon (a-Si), silicon nitride (SiN), silicon carbonitride (SiCN), or other dielectric materials that act as an oxygen barrier, or combinations thereof.

Figure 12:
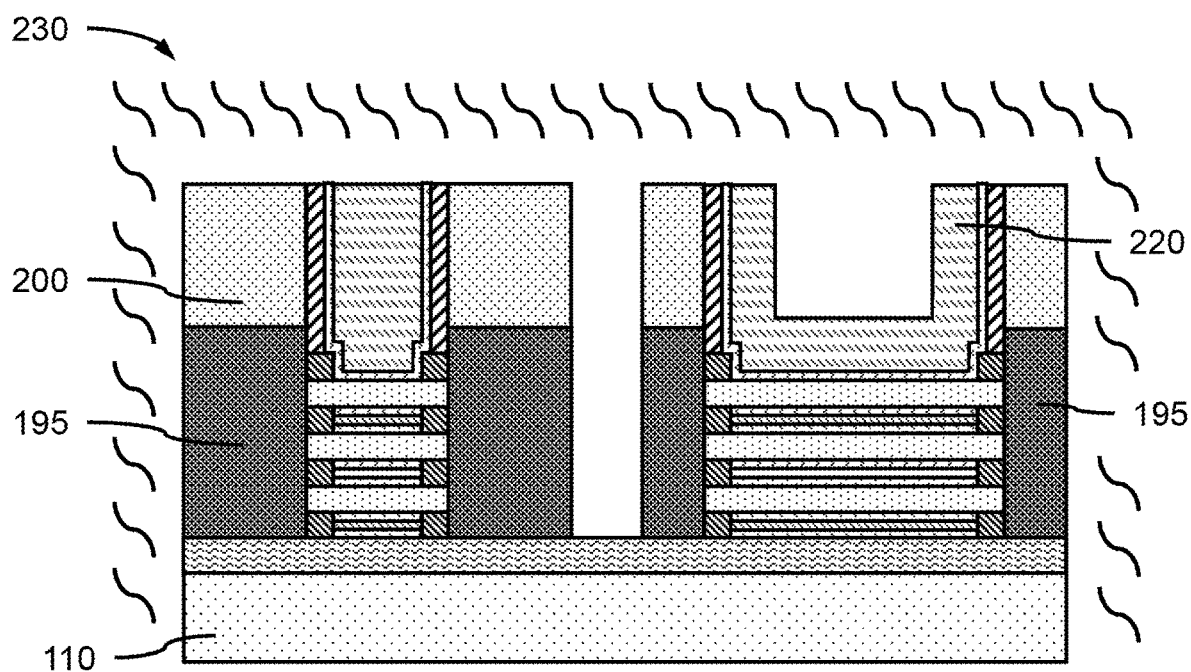
FIG. 12 is a cross-sectional side view perpendicular to FIG. 1 showing a recrystallization treatment to the amorphous source/drain fills of each of the long channel and short channel nanosheet devices, in accordance with an embodiment of the present invention.

FIG. 12 is a cross-sectional side view perpendicular to FIG. 1 showing a recrystallization treatment to the amorphous source/drain fills of each of the long channel and short channel nanosheet devices, in accordance with an embodiment of the present invention.

In one or more embodiments, the amorphous source/drain fills 190, source/drain encapsulation layer 200, and protective capping layer 220 can be heat treated to cause recrystallization of the amorphous source/drain fills 190. In various embodiments, the recrystallization treatment can be conducted in a temperature range of about 800° C. to about 1100° C., or about 900° C. to about 1000° C. to cause a phase change from the amorphous state to a single crystal or poly-crystalline phase source/drain 195, for example, through solid-phase epitaxy.

Figure 13:
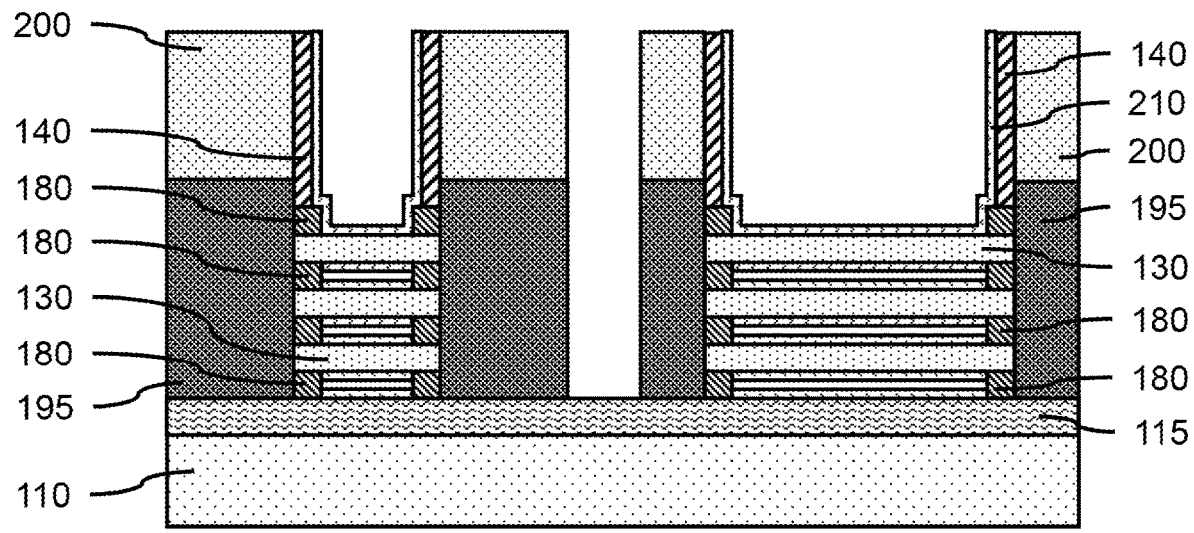
FIG. 13 is a cross-sectional side view perpendicular to FIG. 1 showing the removal of the protective capping layer from the gate dielectric layer and nanosheet layers, in accordance with an embodiment of the present invention.

FIG. 13 is a cross-sectional side view perpendicular to FIG. 1 showing the removal of the protective capping layer from the gate dielectric layer and nanosheet layers, in accordance with an embodiment of the present invention.

In one or more embodiments, the protective capping layer 220 can be removed to expose the gate dielectric layer 210, where the protective capping layer 220 can be removed using a selective, isotropic etch.

Figure 14:
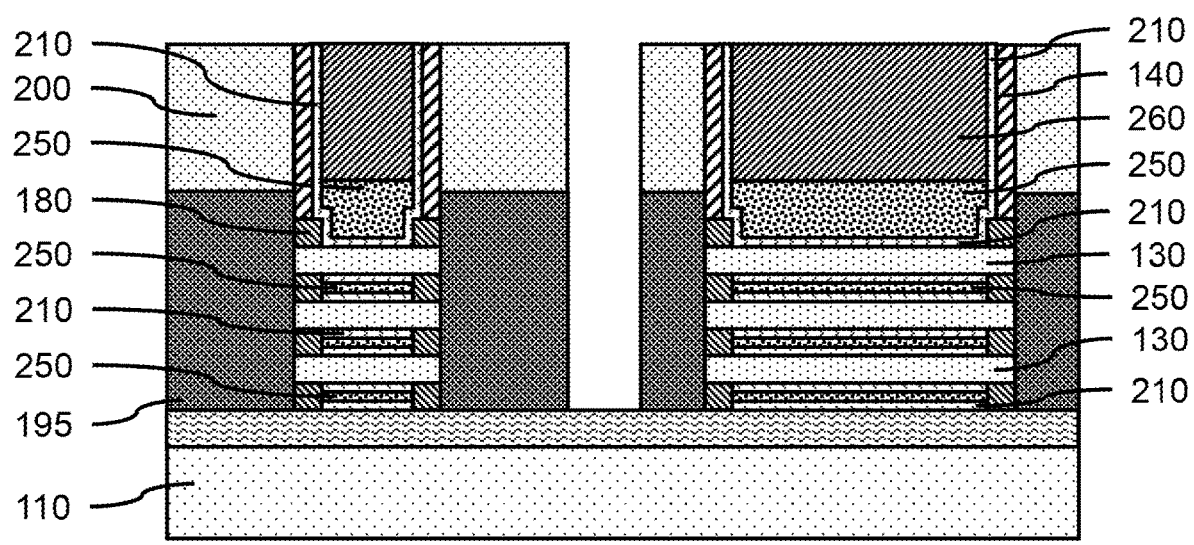
FIG. 14 is a cross-sectional side view perpendicular to FIG. 1 showing the formation of a conductive gate fill on the gate dielectric layer and nanosheet layers, and a gate capping layer on the conductive gate fill, in accordance with an embodiment of the present invention.

FIG. 14 is a cross-sectional side view perpendicular to FIG. 1 showing the formation of a conductive gate fill on the gate dielectric layer and nanosheet layers, and a gate capping layer on the conductive gate fill, in accordance with an embodiment of the present invention.

In one or more embodiments, a conductive gate fill 250 can be formed on the gate dielectric layer 210 and nanosheet layers 130, where the conductive gate fill 250 can be formed by a conformal deposition to fill in the gaps between adjacent nanosheet layers 130.

In one or more embodiments, the conductive gate fill 250 can be a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), tantalum magnesium carbide (TaMgC), carbon nanotubes (CNT), conductive carbon, graphene, or any suitable combination of these materials.

In one or more embodiments, a gate capping layer 260 can be formed on the conductive gate fill 250, where the gate capping layer 260 can be formed by a conformal or blanket deposition, and excess material removed from the surface of the source/drain encapsulation layer 200 using a chemical-mechanical polishing (CMP). The gate capping layer 260 can be a dielectric material, including, but not limited to, silicon oxide (SiO), silicon nitride (SiN), silicon oxynitride (SiON), silicon boronitride (SiBN), silicon carbonitride (SiCN), silicon boro carbonitride (SiBCN), and combinations thereof.

Figure 15:
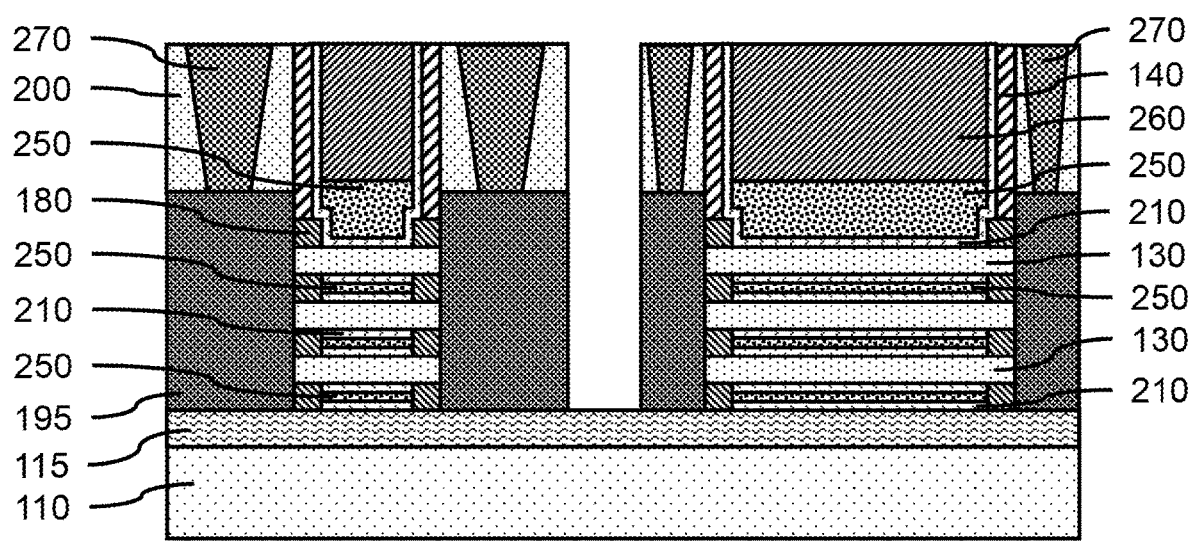
FIG. 15 is a cross-sectional side view perpendicular to FIG. 1 showing the formation of source/drain contacts to the recrystallized source/drains of the long channel and short channel nanosheet devices, in accordance with an embodiment of the present invention.

FIG. 15 is a cross-sectional side view perpendicular to FIG. 1 showing the formation of source/drain contacts to the recrystallized source/drains of the long channel and short channel nanosheet devices, in accordance with an embodiment of the present invention.

In one or more embodiments, a source/drain contact 270 can be formed to each of the recrystallized source/drains 195, where the source/drain contacts 270 can be formed by creating an opening in the source/drain encapsulation layer 200 and filling the opening with a conductive material (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), tantalum magnesium carbide (TaMgC), carbon nanotubes (CNT), conductive carbon, graphene, or any suitable combination of these materials.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments and is not ended to be limiting of embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements car features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a nanosheet device, comprising:
   forming two amorphous source/drain fills on a substrate and one or more semiconductor nanosheet layers between the two amorphous source/drain fills;
   forming a gate dielectric layer on exposed portions of the one or more semiconductor nanosheet layers;
   forming a protective capping layer on the gate dielectric layer; and
   subjecting the two amorphous source/drain fills to a recrystallization treatment to cause a phase change from the amorphous state to a single crystal or poly-crystalline phase.

2. The method of claim 1, wherein the recrystallization treatment is conducted in a temperature range of about 800° C. to about 1100° C.

3. The method of claim 2, wherein the recrystallization treatment is conducted in a temperature range of about 900° C. to about 1000° C.

4. The method of claim 2, wherein the recrystallization treatment forms a single crystal source/drain.

5. The method of claim 1, further comprising removing the protective capping layer to expose the underlying gate dielectric layer.

6. The method of claim 5, further comprising forming a conductive gate fill on the gate dielectric layer.

7. The method of claim 6, wherein the two amorphous source/drain fills are formed at a temperature in a range of about 500° C. to about 700° C. to maintain the source/drain fill in an amorphous state.

8. The method of claim 7, wherein the two amorphous source/drain fills are made of phosphorus-doped silicon (Si:P) or boron-doped silicon germanium (SiGe:B).

9. A method of forming long channel and short channel nanosheet devices on a substrate, comprising:
   forming at least two stacks of alternating sacrificial layers and semiconductor nanosheet layers on a substrate;
   forming a separate gate sidewall spacer and dummy gate structure across each of at least two of the at least two stacks of alternating sacrificial layers and semiconductor nanosheet layers;
   forming a separate amorphous source/drain fill on each of opposite sides of the at least two of the at least two stacks of alternating sacrificial layers and semiconductor nanosheet layers;
   forming a source/drain encapsulation layer on each of the amorphous source/drain fills;
   removing the at least two dummy gate structures;
   removing the sacrificial layers from the at least two of the at least two stacks of alternating sacrificial layers and semiconductor nanosheet layers;
   forming a gate dielectric layer on exposed portions of the semiconductor nanosheet layers of the at least two stacks of alternating sacrificial layers and semiconductor nanosheet layers;
   forming a protective capping layer on the gate dielectric layer; and
   subjecting the amorphous source/drain fills to a recrystallization treatment to cause a phase change from the amorphous state to a single crystal or poly-crystalline phase, wherein the semiconductor nanosheet layers of a first of the at least two of the at least two stacks form shorter device channels than the semiconductor nanosheet layers of a second of the at least two of the at least two stacks.

10. The method of claim 9, further comprising removing a portion of each of the sacrificial layers to form channels adjacent to each of the sacrificial layers, and forming an inner spacer in each of the channels.

11. The method of claim 9, wherein the recrystallization treatment is conducted in a temperature range of about 800° C. to about 1100° C.

12. The method of claim 11, wherein the recrystallization treatment is conducted in a temperature range of about 900° C. to about 1000° C.

13. The method of claim 11, wherein the recrystallization treatment forms a single crystal source/drain.

14. The method of claim 13, wherein the amorphous source/drain fills are formed by chemical vapor deposition at a temperature in a range of about 500° C. to about 700° C. to maintain the source/drain fill in an amorphous state.

15. The method of claim 13, wherein the protective capping layer is made of an oxygen barrier material selected from the group consisting of amorphous silicon (a-Si), silicon nitride (SiN), silicon carbonitride (SiCN), and combinations thereof.

* * * * *